(12) United States Patent
Boykin et al.

(10) Patent No.: US 6,967,833 B2
(45) Date of Patent: Nov. 22, 2005

(54) PROTECTIVE APPARATUS FOR SENSITIVE COMPONENTS

(75) Inventors: Paul Boykin, Nashville, TN (US); Alan Taylor, Parrish, FL (US)

(73) Assignee: Integrian, Inc., Durham, NC (US)

( * ) Notice: Subject to any disclaimer, the term of this patent is extended or adjusted under 35 U.S.C. 154(b) by 13 days.

(21) Appl. No.: 10/464,558

(22) Filed: Jun. 19, 2003

(65) Prior Publication Data

US 2004/0070926 A1 Apr. 15, 2004

Related U.S. Application Data

(60) Provisional application No. 60/389,895, filed on Jun. 20, 2002.

(51) Int. Cl.[7] .................................................. G06F 1/16
(52) U.S. Cl. ...................................... 361/685; 361/683
(58) Field of Search .......................... 361/679, 683–687

(56) References Cited

U.S. PATENT DOCUMENTS

| | | | | |
|---|---|---|---|---|
| 6,271,604 B1 * | 8/2001 | Frank et al. | ................. | 307/112 |
| 6,297,950 B1 * | 10/2001 | Erwin | ........................ | 361/685 |
| 6,320,744 B1 * | 11/2001 | Sullivan et al. | ............. | 361/685 |

* cited by examiner

*Primary Examiner*—Yean-Hsi Chang
(74) *Attorney, Agent, or Firm*—Sughrue Mion, PLLC

(57) ABSTRACT

The present invention is directed to a protective apparatus for housing and protecting sensitive components disposed therein, such as a central processing unit (CPU) or a hard drive. The protective apparatus includes an outer casing, a fan panel, a connector panel, an internal box including the sensitive components and located within the outer casing, an internal housing contained within the internal box, and shock assemblies suspending the internal housing within the internal box.

17 Claims, 16 Drawing Sheets

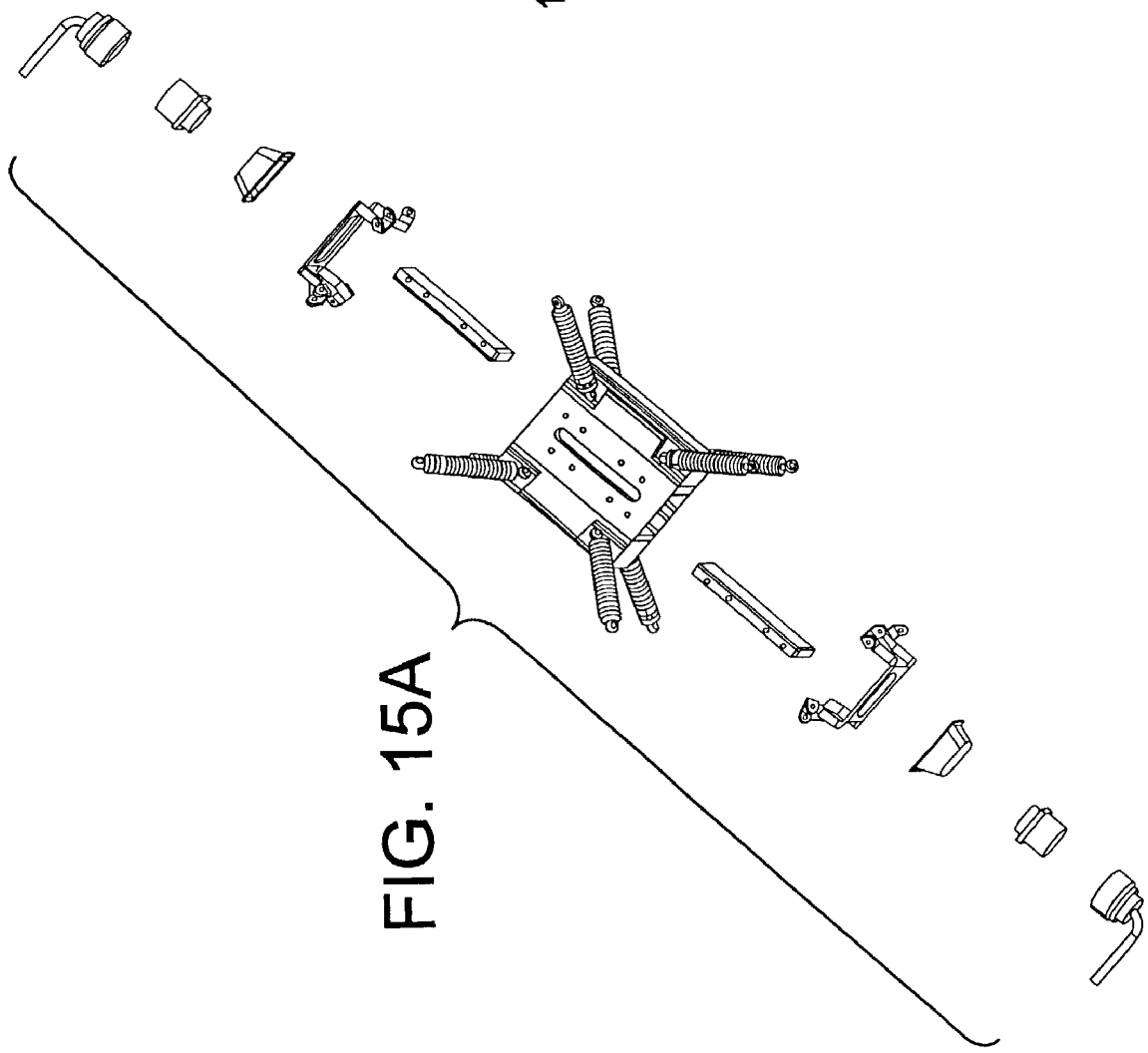
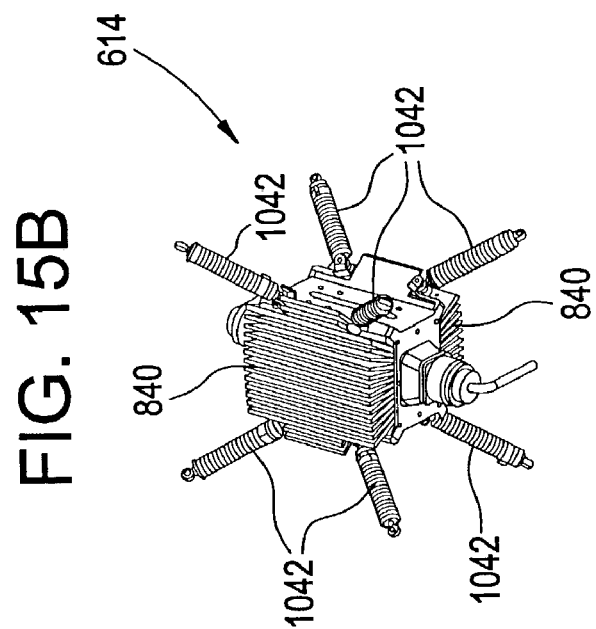

PROTECTIVE APPARATUS FOR SENSITIVE COMPONENTS

This application claims benefit of Provisional Application No. 60/389,895 filed Jun. 20, 2002; the disclosure of which is incorporated herein by reference.

BACKGROUND OF THE INVENTION

This invention relates to an apparatus for protecting sensitive components, for example, central processing units (CPUs) or hard drives, that are to be used in a heavy-duty environment such as within a vehicle. In particular, the present invention is directed to a protective apparatus for a hard drive used with a digital patroller device. Such a patroller device is used in a surveillance system which digitally records and stores audio, video and other data, and is often used in public safety or commercial vehicles.

Hard drives which can tolerate rough treatment are already known. Those hard drives are very difficult to find and expensive. Fitting vehicles with such an expensive hard drive is impractical, but this invention allows for protection of even the most commonly available and inexpensive hard drives.

A problem with placing a hard drive in a public or commercial vehicle is that the vehicle can often provide a hostile environment for the hard drive. The hard drive is expected to function continually at a high level yet can be subjected to rough handling such as high temperatures when the vehicle is left parked for long periods of time, jostling during high speed driving, high impact forces in the event of a collision or shooting, and other stressors.

The present invention sets forth a solution to the problems stated above.

SUMMARY OF THE INVENTION

The present invention provides a protective apparatus for sensitive components. The protective apparatus can withstand high velocity impact, static vibration, high/low frequency sine wave and random vibrations (e.g., root-mean-square acceleration (Grms) vibrations), and other extreme conditions. This protection is accomplished in the present invention by a protective apparatus such as that described below, which will be assumed, for nonlimiting descriptive purposes only, to be protecting a hard drive.

In addition, the present invention provides an effective and efficient method for making the protective apparatus, including the steps of compression molding various housing elements and assembling the components.

The invention includes the use of composite materials which are particularly suited for the function of the protective apparatus, and such materials improve the efficiency of making the protective apparatus in an efficient and inexpensive manner.

The present invention also provides a cooling system to maintain the hard drive temperature below a desired temperature. This cooling system may include a fan panel which promotes air circulation in the protective apparatus.

Moreover, the invention involves a structure for applying and dampening forces using, for example, a plurality of shock absorbers configured around the hard drive in one of a plurality of configurations.

The present invention provides a protective, thermal conductive impact- and shock-resistant protective apparatus which may be particularly suitable for use in police enforcement vehicles.

BRIEF DESCRIPTION OF THE DRAWINGS

The objects and advantages of the present invention will become more apparent by describing in detail preferred embodiments thereof with reference to the attached drawings in which:

FIG. 15A illustrates another preferred embodiment of the present invention;

FIG. 15B illustrates an exploded view of another preferred embodiment of the present invention.

DETAILED DESCRIPTION OF THE INVENTION

Figure 1:
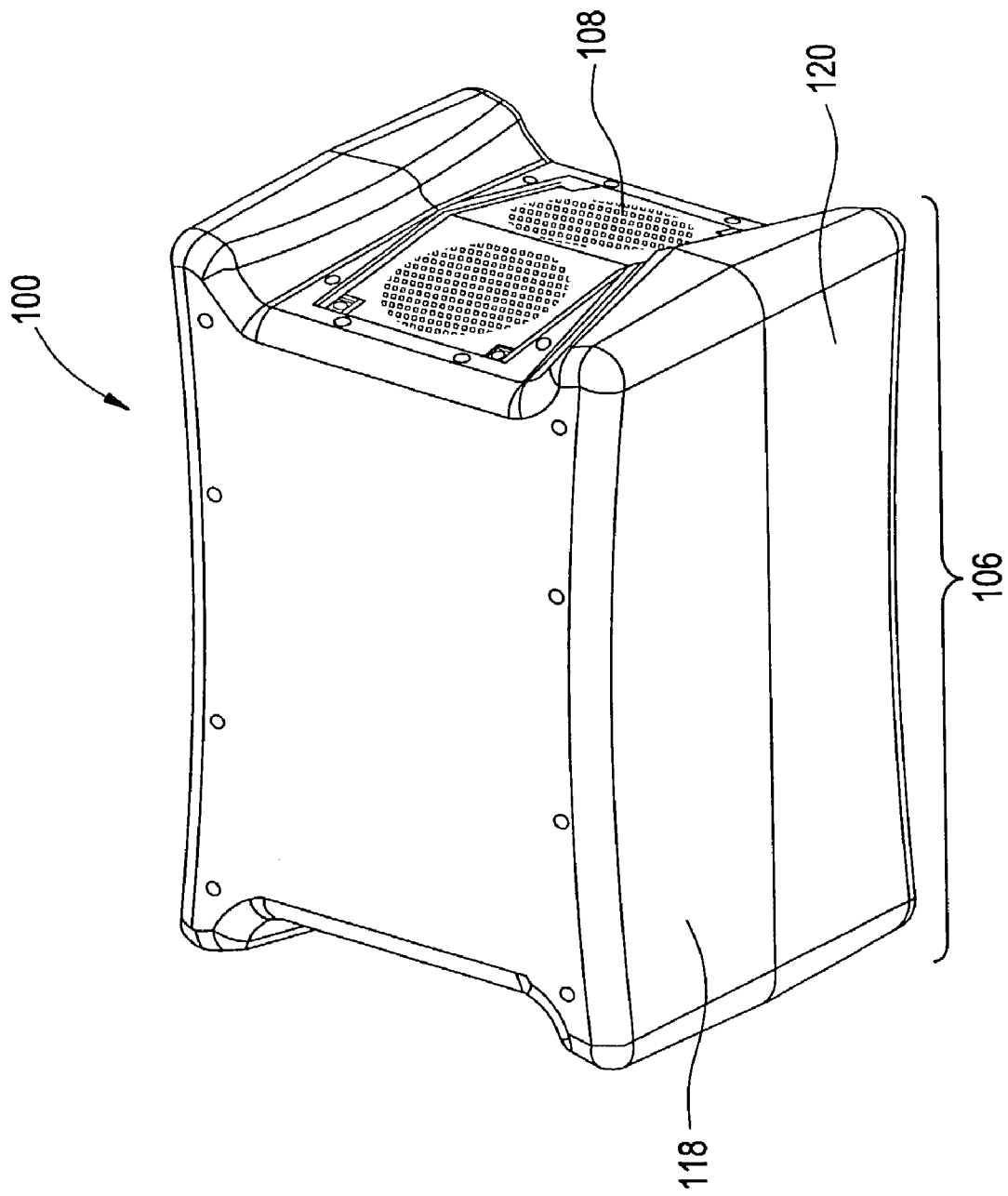
FIG. 1 illustrates the present invention.
Figure 2:
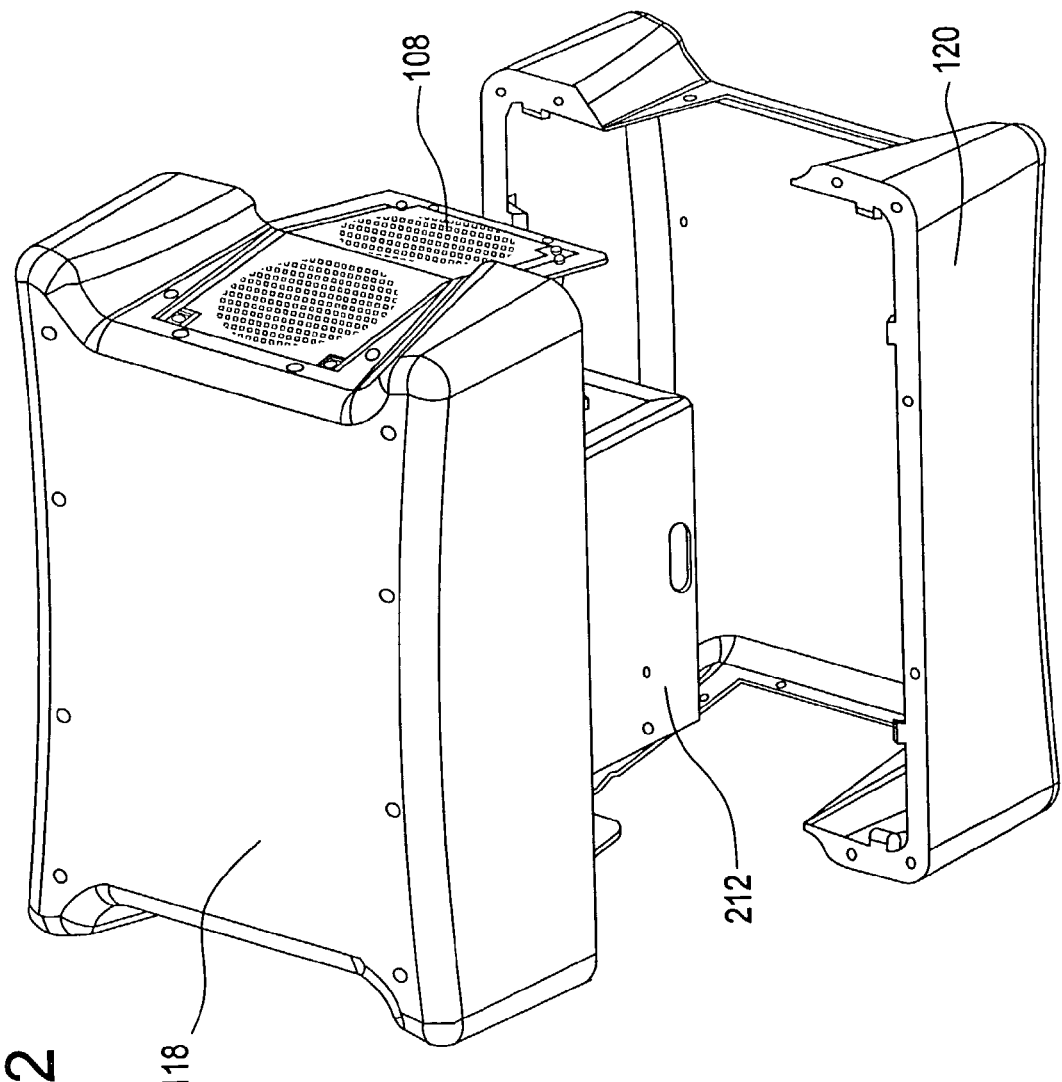
FIG. 2 illustrates an exploded partial view of the present invention.

A protective apparatus 100 will now be described according to a preferred embodiment of the invention in conjunction with the Figures.

The present invention is directed to a protective apparatus 100 for housing and protecting sensitive components disposed therein, such as a central processing unit (CPU) 602 or a hard drive 904. The present invention may be readily deployed on police, fire, rescue, transportation, and industrial vehicles, as well as in rail and airline applications. The present invention is not limited to these applications, and may be used in any environment in which either mobile or non-mobile sensitive components must be protected.

The present invention includes an outer casing 106, a fan panel 108, a connector panel 410, an internal box 212 within the outer casing 106, an internal housing 614 contained within the internal box 212, and shock assemblies 616 suspending the internal housing 614 within the internal box 212.

Figure 4:
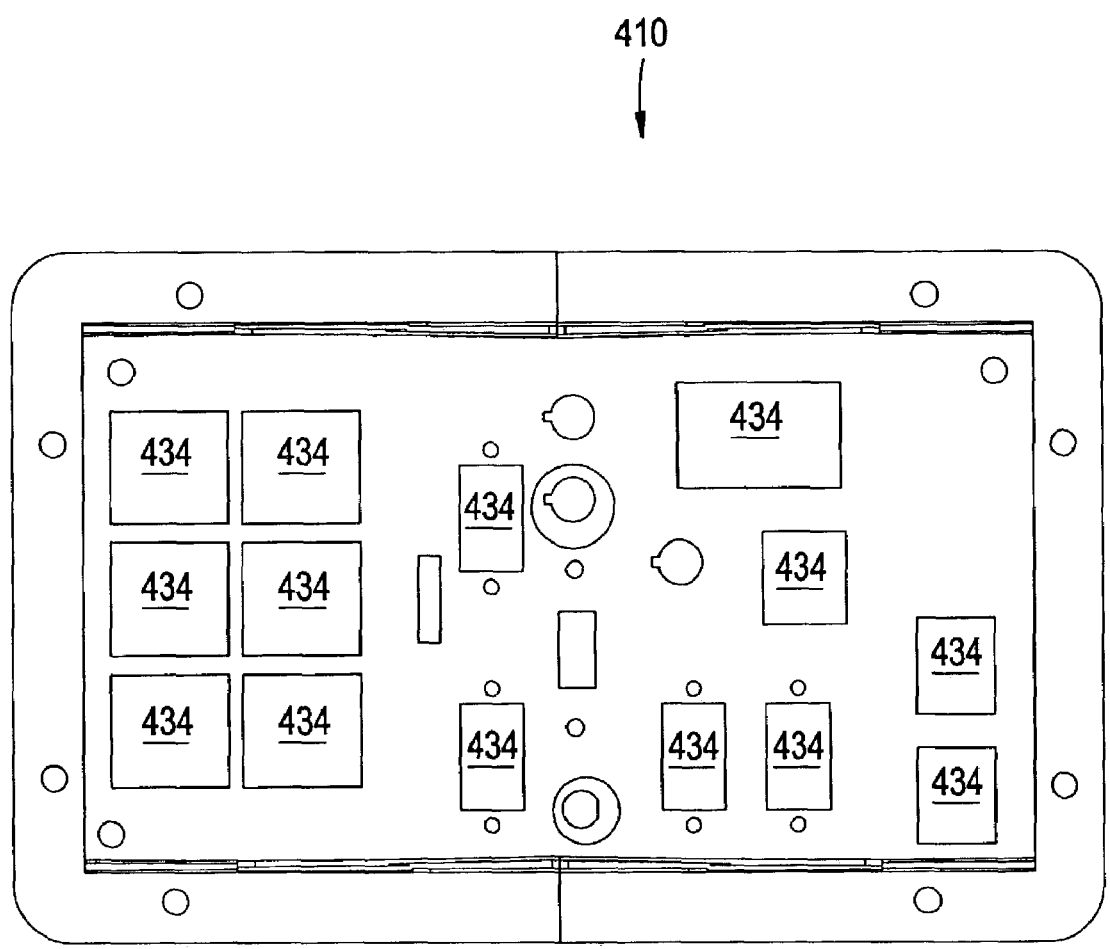
FIG. 4 illustrates a connector panel.
Figure 5:
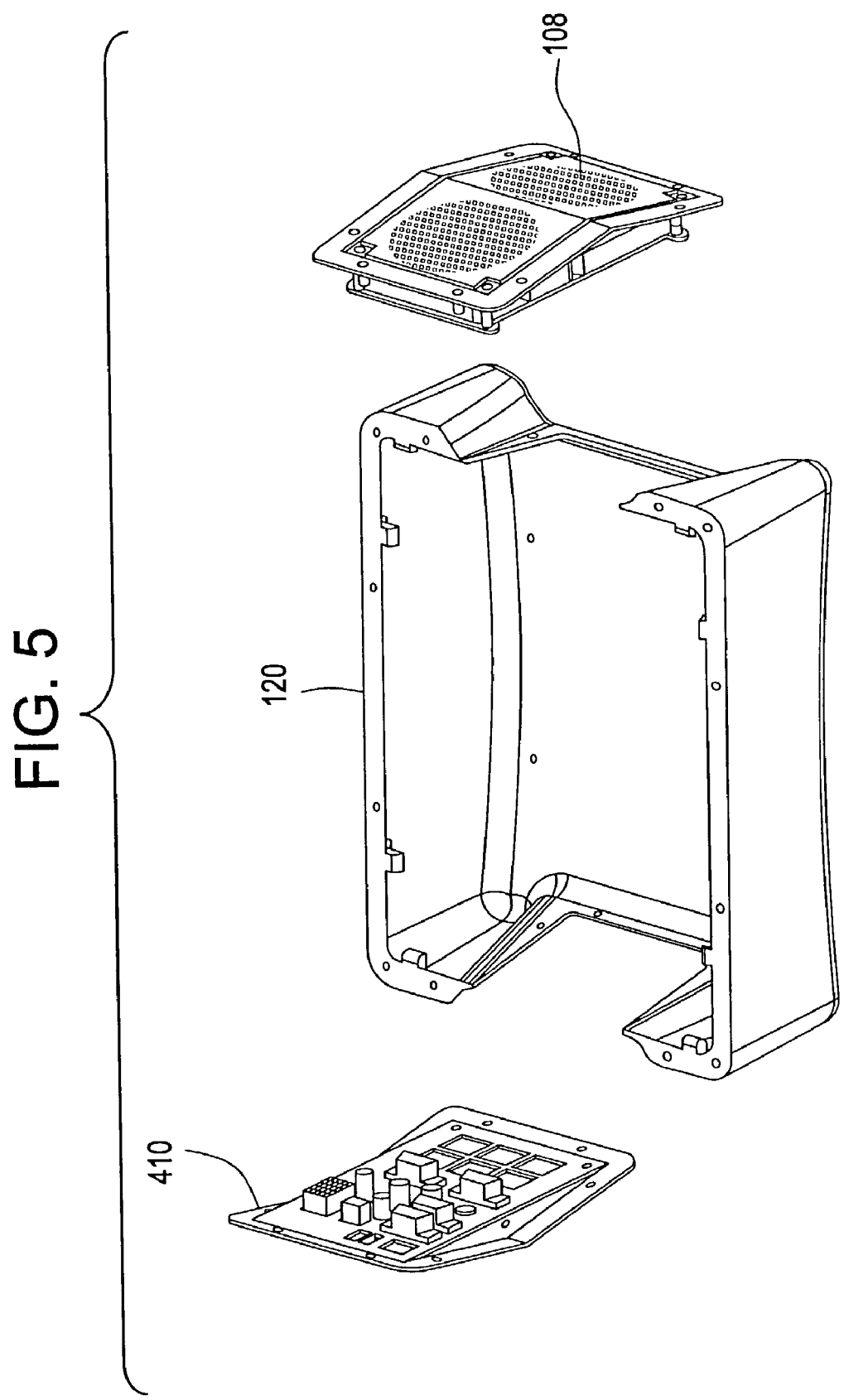
FIG. 5 illustrates a partial top view of the present invention.

As shown in the preferred embodiment of FIG. 1, the outer casing 106 includes two outer shells 118,120, a top shell 118 and a bottom shell 120, the fan panel 108, and the connector panel 410(see FIGS. 4 and 5). Each outer shell 118,120 is preferably provided with structural supports (not shown), possibly formed of aluminum or sheet metal. The top shell 118 is optionally provided with alignment pins (not shown) in order to facilitate the mating of the top and bottom shells 118,120. The bottom shell 120 would therefore be provided with holes to receive the alignment pins. A sheet metal bracket and gasket (not shown) may also be included for the structural supports and alignment pins. An aerospace grade epoxy adhesive, or other suitable means, may be used to bond the aluminum, sheet metal, structural supports and alignment pins to each shell. The specific fastening methods used to interconnect various components of the present invention are given as examples and are not essential to the present invention.

According to a preferred embodiment, each shell 118,120 is made by compression molding, i.e. stamping, a carbon fiber thermoset/thermoplastic hybrid composite. The carbon fiber thermoset/thermoplastic hybrid composite could be, but is not limited to, Carbon Fiber/Nylon 6. In addition, the shell 118,120 may include nickel plated fiber molded on the inside surface of the carbon fiber thermoset/thermoplastic hybrid composite for added electromagnetic interference (EMI) shielding benefits.

Figure 3:
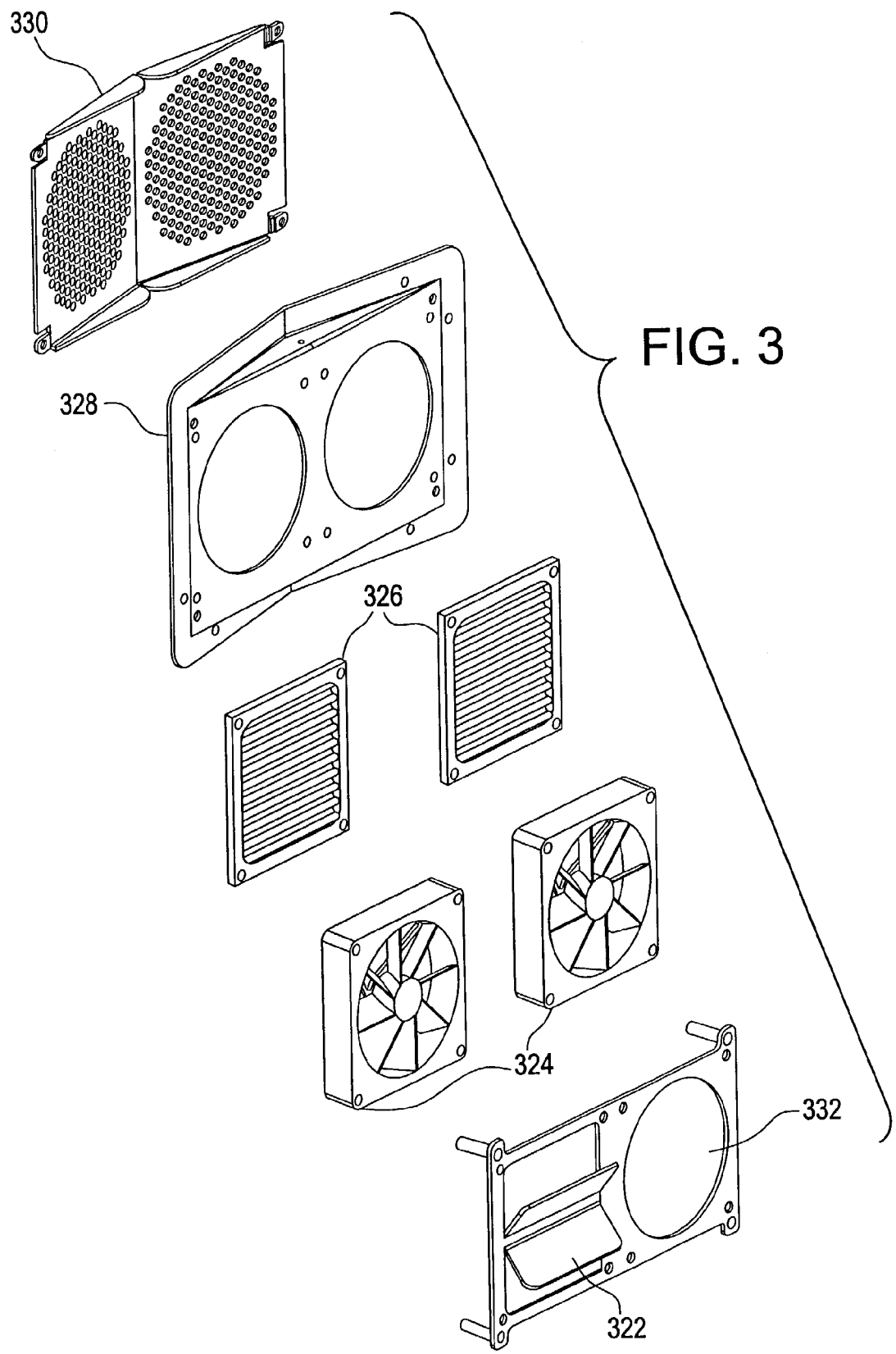
FIG. 3 illustrates an exploded view of a fan panel.

The fan panel 108 is preferably provided for cooling a hard drive or hard drives disposed within the outer casing 106. The fan panel 108 may include exhaust fins 322, at least one fan 324, at least one EMI filter 326, an end cover back 328 and a media cover 330, with an example of a suitable assembly shown in the exploded view of FIG. 3. The fan panel 108 is optionally made from die-cast 6061-T6 aluminum and hard black anodized which provides support for the two fans 324 and an aluminum sheet metal air deflector 332, as shown in FIG. 3. The fan panel preferably includes filtration media (not shown), a perforated sheet metal media cover 330, a foam filter (possibly provided within the media cover 330), and an EMI filter 326.

Louvers and fans guide air around the interior of the protective apparatus 100. An aluminum sheet metal air deflector 332 works in conjunction with the fan 324, which is preferably a profile fan 324. The profile fan 324 is preferably no thicker than 20 mm, and measures 80×80×15 mm in a preferred embodiment of the invention. Two fans 324 may be used to provide efficient air flow. The air flow is particularly important for a protective apparatus 100 which is exposed to heat for extended periods of time, such as when the protective apparatus 100 is used in a vehicle in a warm climate, or when the vehicle is parked in the sun for an extended period of time. The fans 324 are controlled by a thermostat (not shown), with additional control optionally provided by the CPU 602. Predetermined settings allow the fans 324 to automatically activate when a predetermined temperature is reached, and the interior of the protective apparatus 100, and in particular the hard drive 904, is cooled accordingly.

The connector panel 410, as shown in FIG. 4, provides input/output ports, with several exemplary ports labeled as 434. The connector panel 410 may be made from die-cast 6061-T6 aluminum and hard black anodized to provide support for input/output connectors (not shown). As shown in FIG. 1, the fan panel 108, along with the connector panel 410, may assist in holding the top and bottom shells 118,120 together. For instance, each of the fan and connector panels 108,410 could include threaded securing holes for receiving screws so as to secure to both the top and bottom shells 108,410, thereby securing the shells 108,410 to each other to form the outer casing 106, as depicted in FIGS. 3–5.

Figure 6:
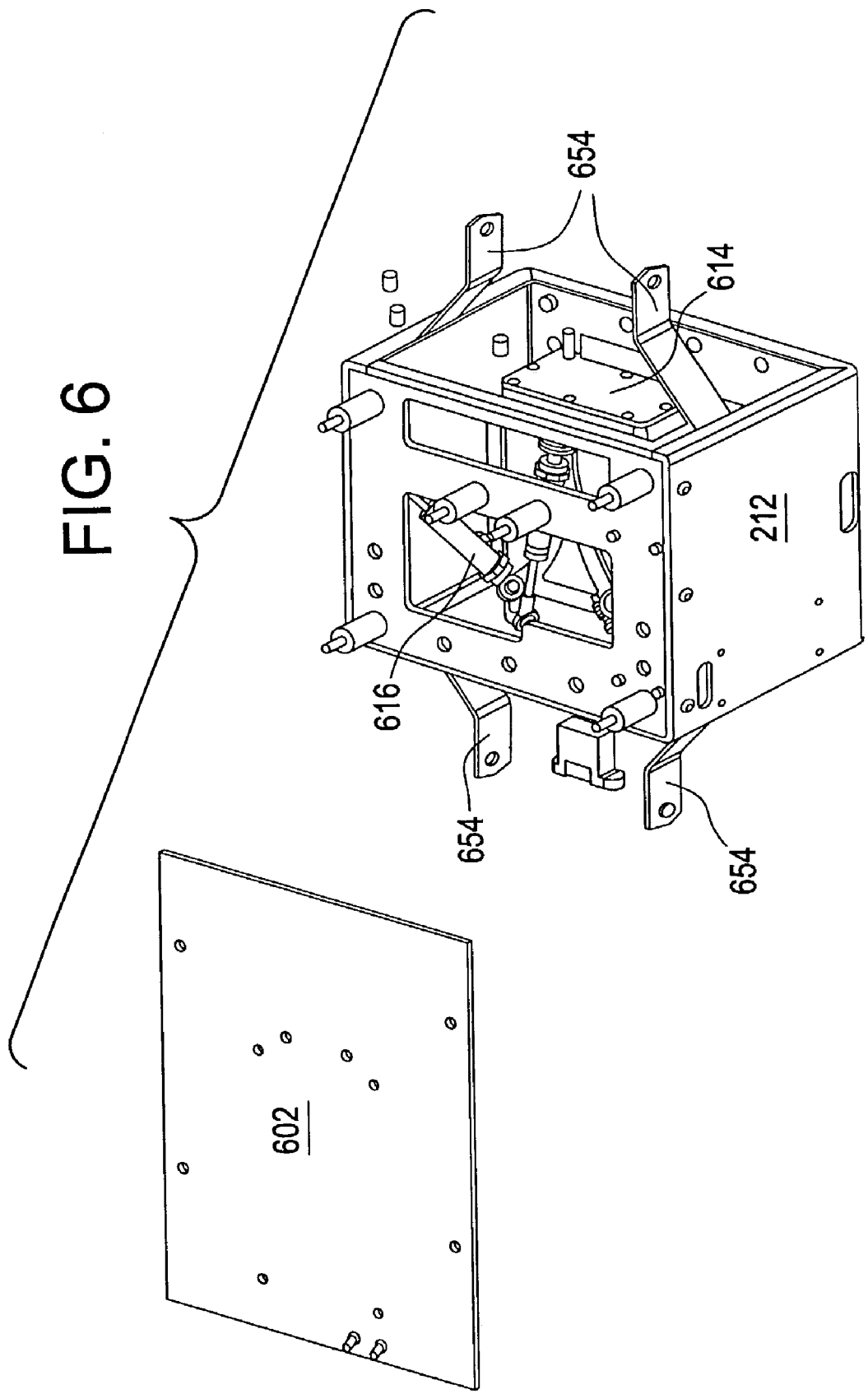
FIG. 6 illustrates an exploded view of an assembled internal box with a CPU.
Figure 7:
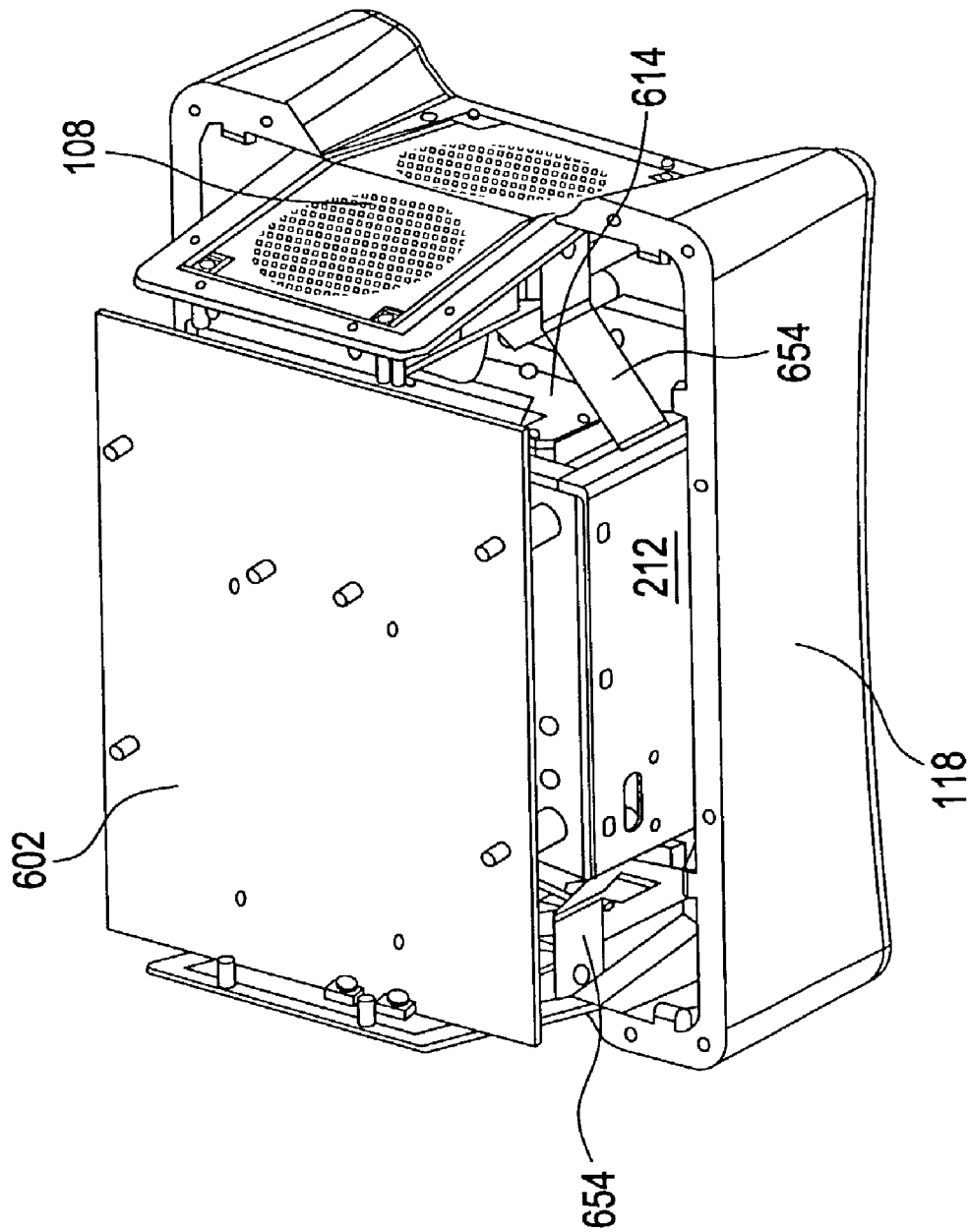
FIG. 7 illustrates a view of a top shell connected to an internal box and fan and connector panels.
Figure 10:
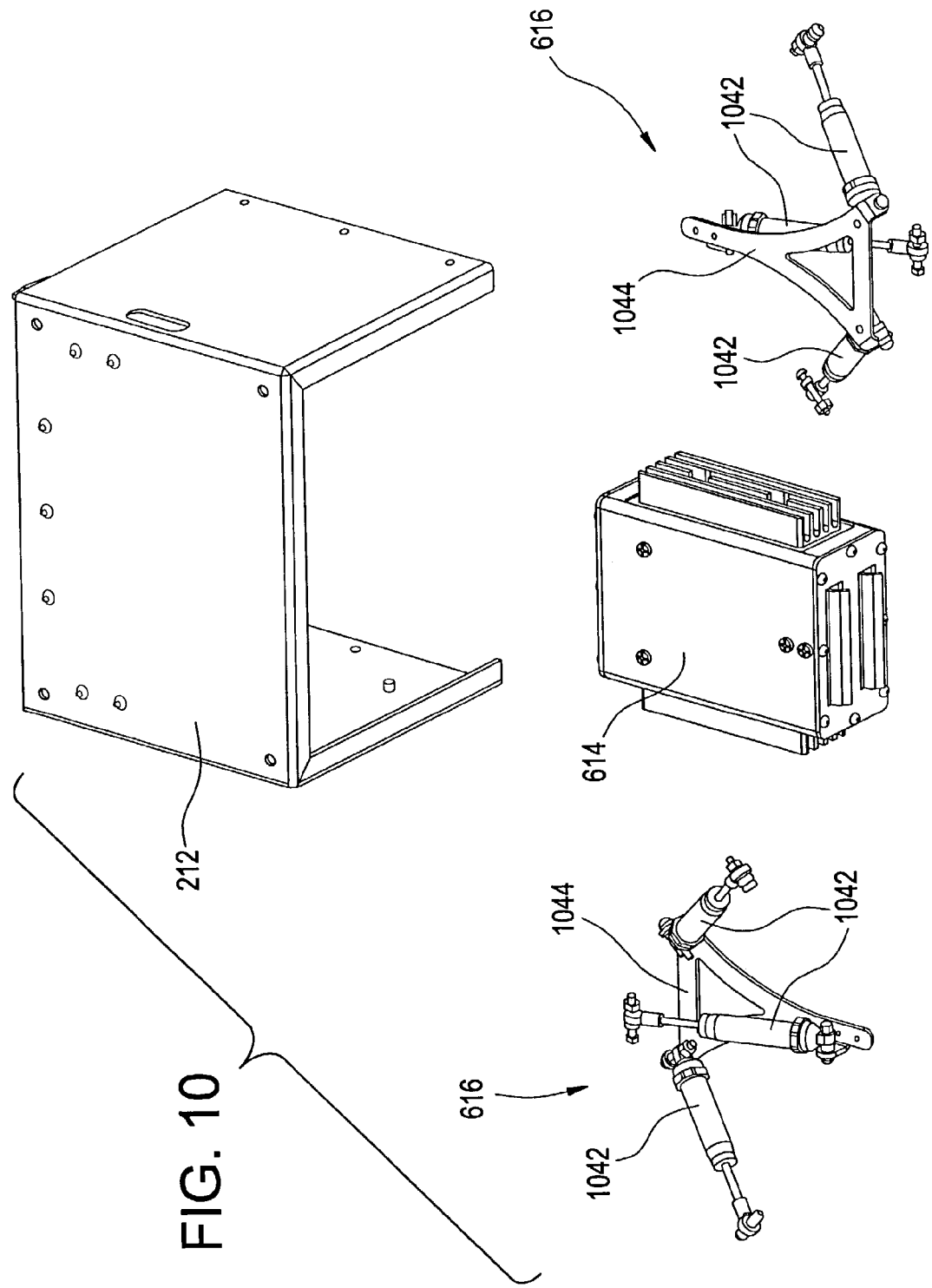
FIG. 10 illustrates an exploded view of the internal box of the present invention.

FIG. 6 depicts an assembled internal box 212 dissembled from a CPU 602, which is shown as a circuit board. The internal box 212 may be made of aluminum or any other suitable material. Preferably, the internal box 212 mounts internally to the top shell 118. The internal box 212 preferably includes two shock assemblies 616 and an internal housing 614 containing at least one hard drive 904, as shown in FIG. 10. The internal box 212 may include flanges 654 which attach the internal box 212 with the fan and connector panels 108,410. These flanges 654 are also useful for facilitating tests to the internal box 212 before the outer casing 106 is assembled with the internal box 212.

Figure 11:
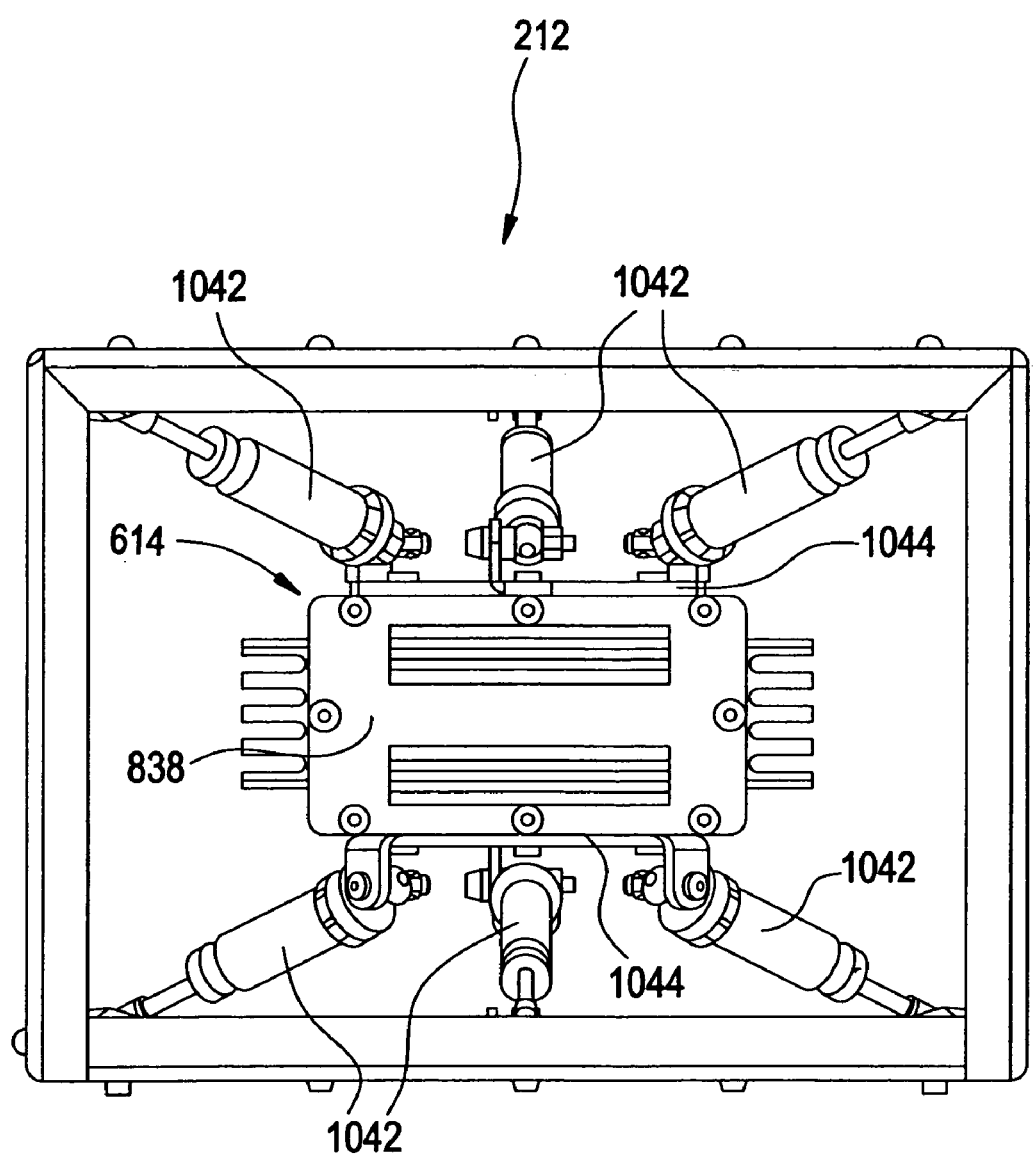
FIG. 11 illustrates shock assemblies in the internal box of an embodiment of the present invention.
Figure 12:
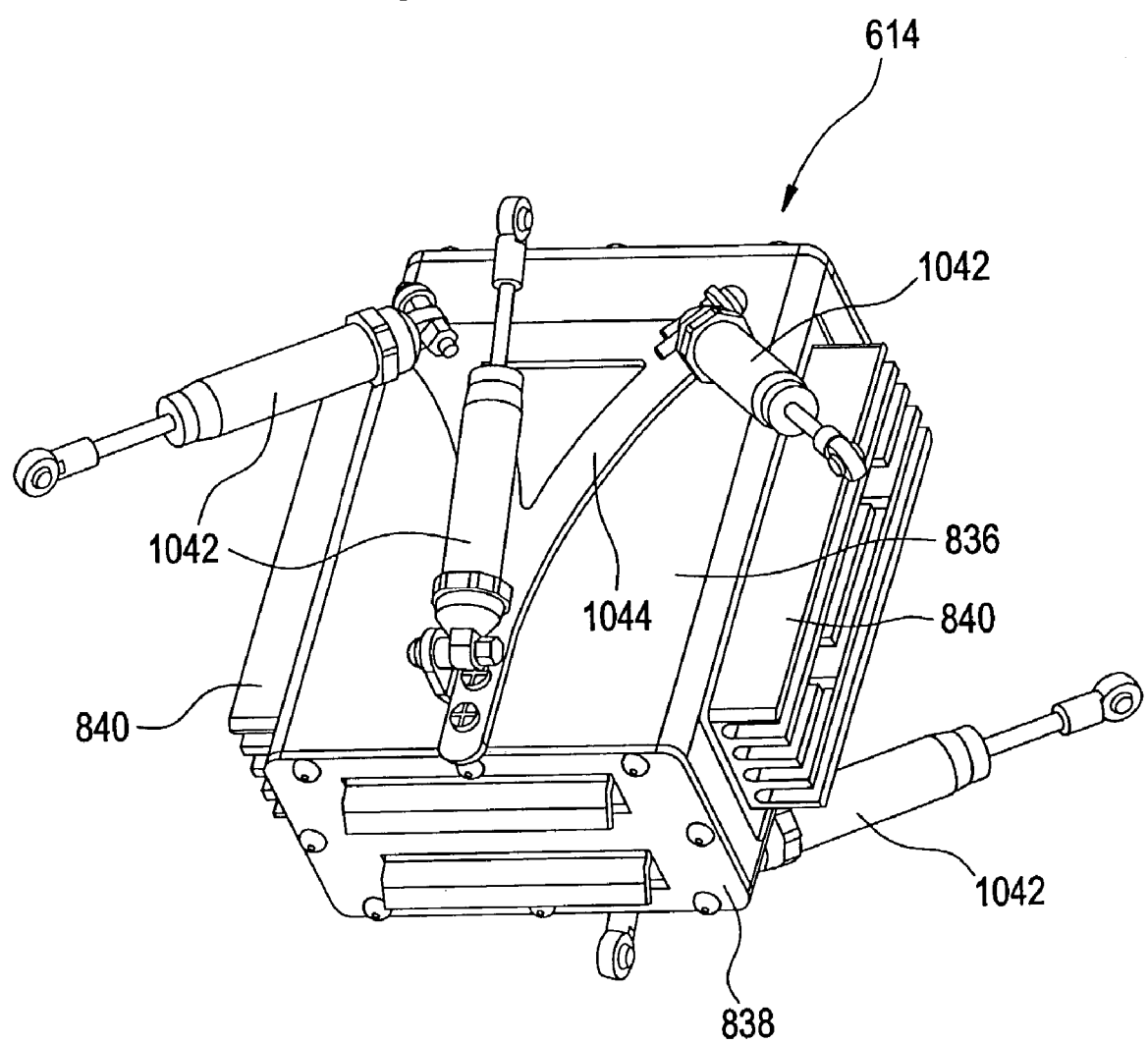
FIG. 12 illustrates the shock assemblies and the internal housing.

The internal housing 614 is disposed inside the internal box 212 via two shock assemblies 616 in a preferred embodiment of the present invention. See FIG. 11 and the associated text for details of the arrangement of these elements. The internal housing 614 is made up of a main body 836 and preferably one or more covers 838, described herein as louvered front and back covers 838. The internal housing 614 may be made from extruded 6061-T6 aluminum.

Figure 9:
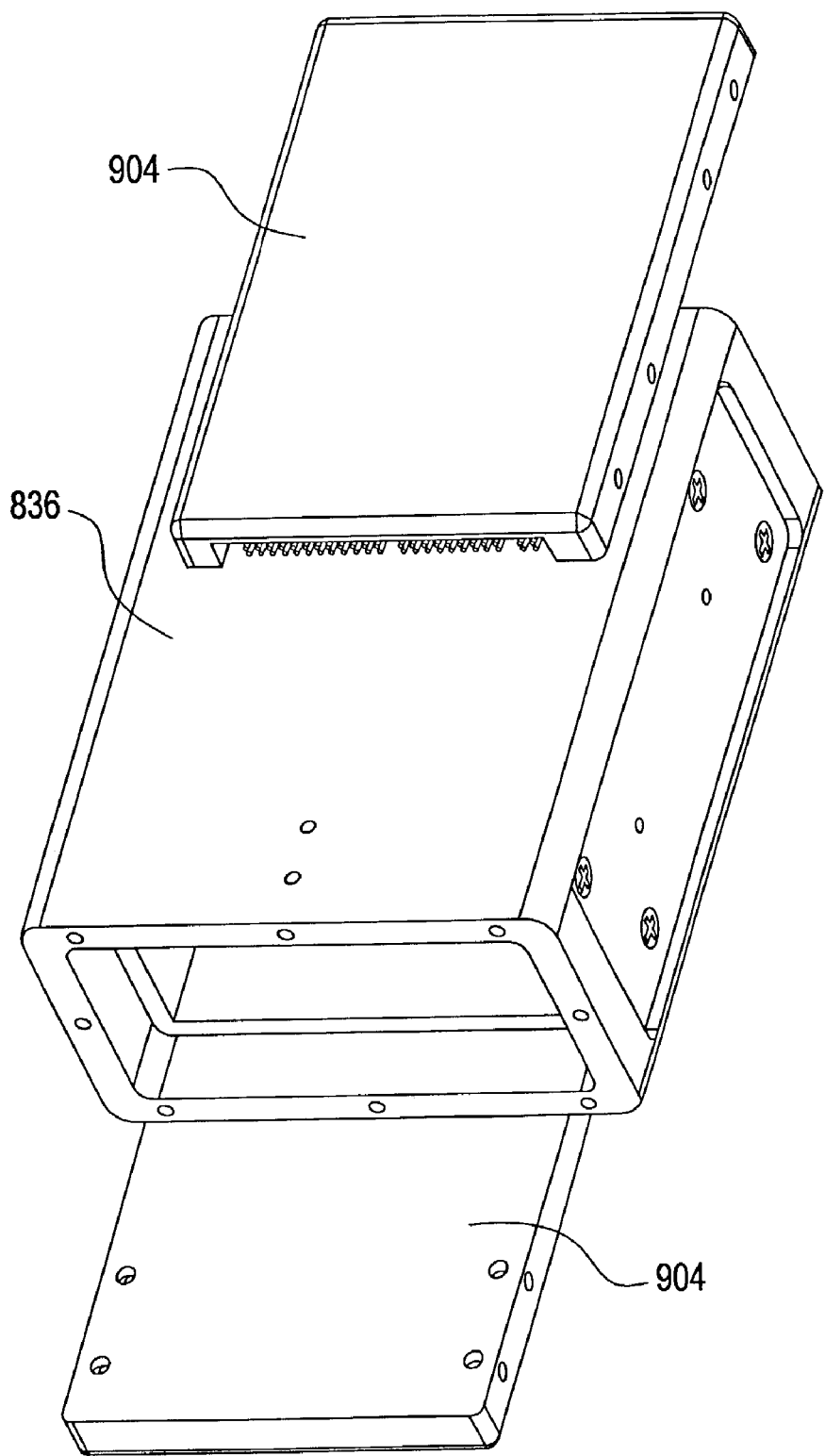
FIG. 9 illustrates the internal housing with two hard drives in a dissembled state before the hard drives are assembled inside the internal housing.

The internal housing 614 is capable of housing at least one hard drive 904, optionally housing two hard drives 904 positioned opposite one another in a mirror image configuration as shown in a dissembled state outside the internal housing 614 in FIG. 9. Of course, any number of hard drives 904 could be provided in a suitable internal housing; however, two hard drives 904 provide the benefit of a back-up hard drive 904 in the event of failure of one of the hard drives 904, and the present invention will be described as including two hard drives 904. The hard drives 904 may be the commonly available random array of inexpensive disks (RAID) drives 904. If one hard drive 904 fails, hard drive 904 may remain in service. In case of failure of one hard drive 904, recorded data should not be lost since the same data was written to both hard drives 904 when saved in this type of redundant system. A preferable hard drive 904 is of the type known as 2.5 inch, e.g., a laptop sized hard drive 904, but other sizes or configurations could be used without altering the present invention.

Figure 8:
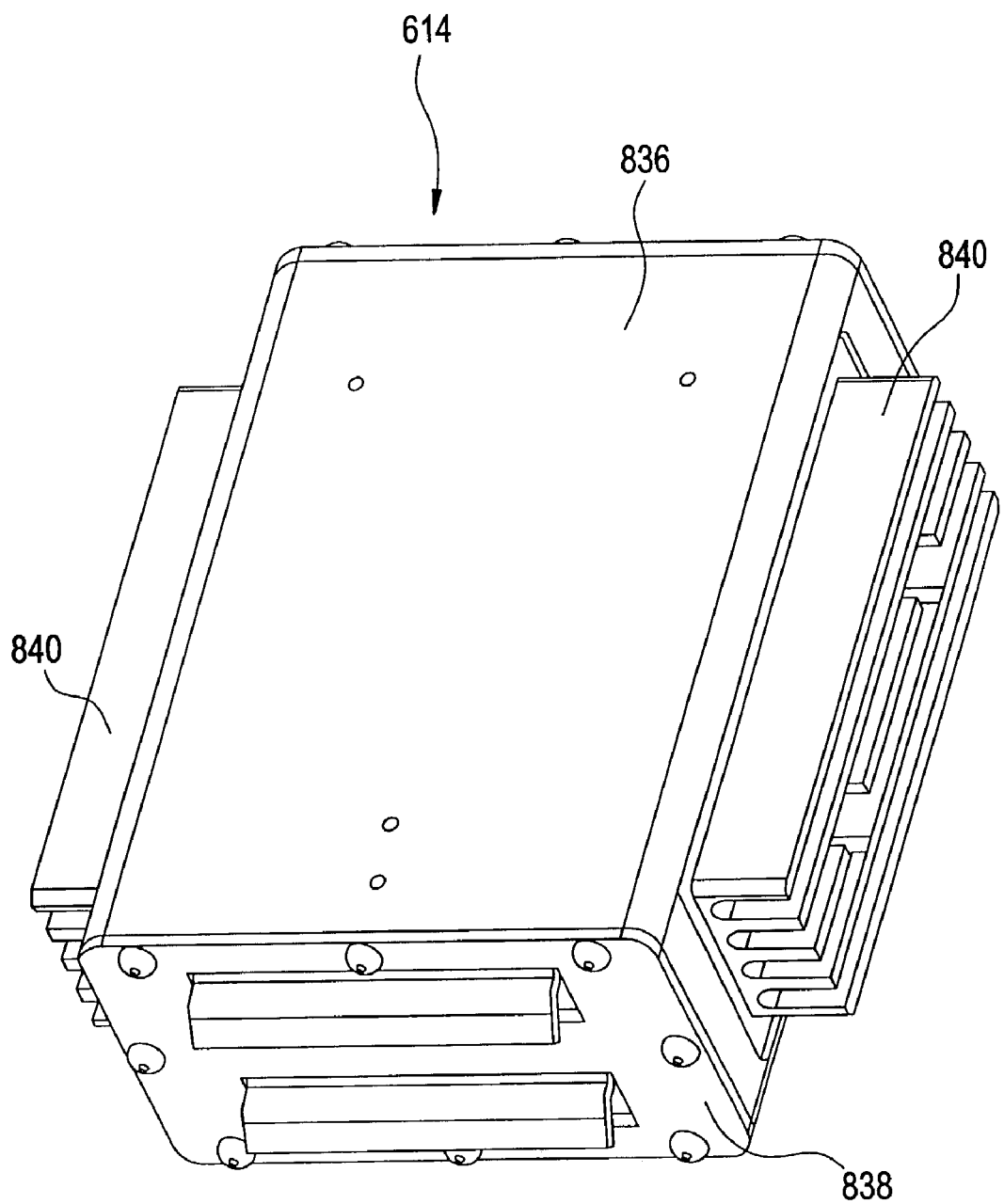
FIG. 8 illustrates an internal housing with a heat sink.

The internal housing 614 preferably includes one or more heat sinks 840, as shown in FIG. 8, which may be attached to the main body 836, and/or the heat sinks 840 may be formed integrally with the main body 836. The heat sinks 840 enhance heat dissipation from the hard drives 904. The internal housing 614 may also be water resistant.

Figure 13:
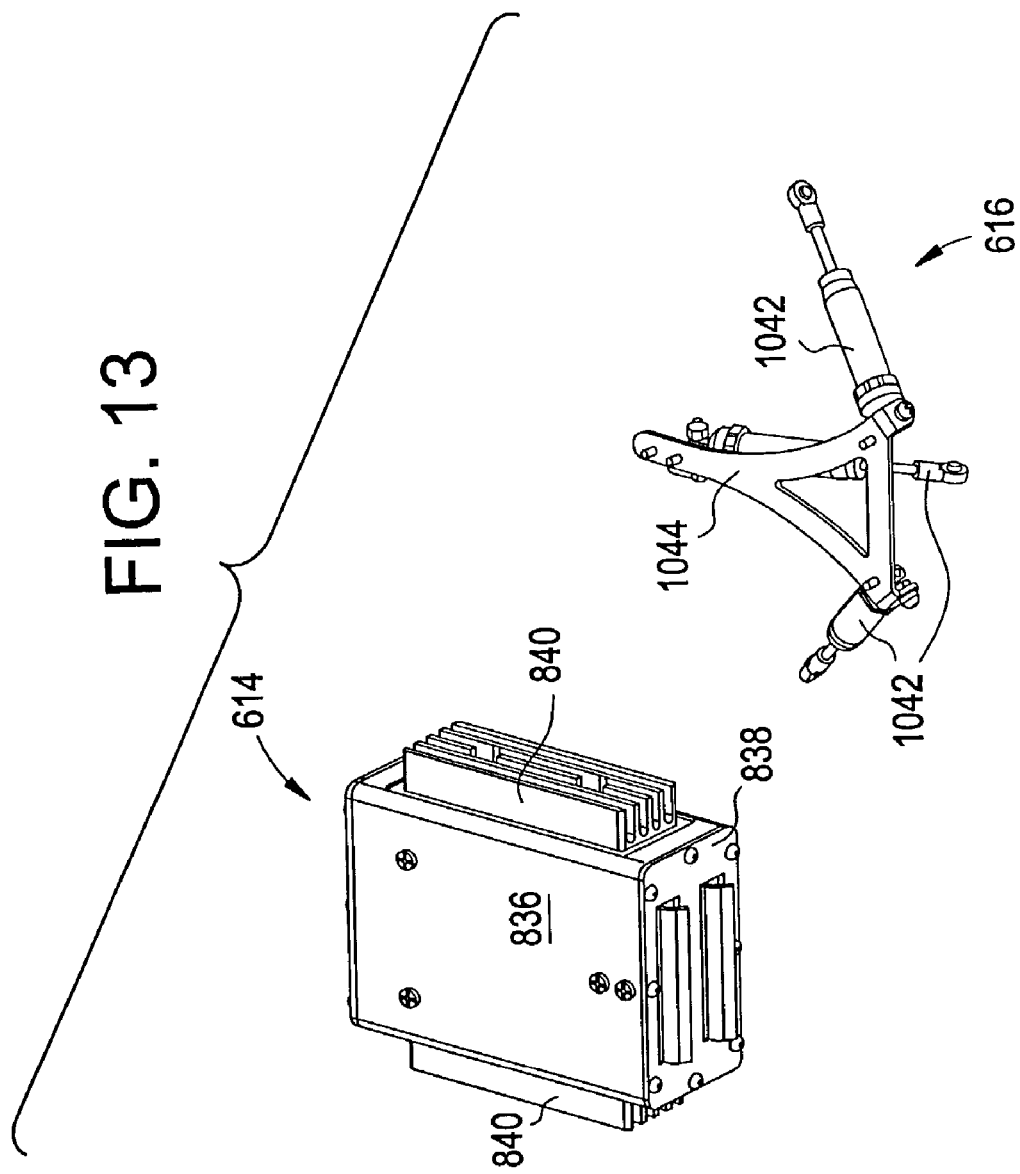
FIG. 13 illustrates an exploded view of the shock mount assemblies and the internal housing.

Each shock assembly 616, which suspends the internal housing 614 inside the internal box 212, is optionally comprised of three positively and negatively charged silicon oil filled shocks 1042 attached to at least one base housing 1044, as shown in FIG. 13. The use of silicon as the oil in the shocks 1042, prevents the hard drives 904 from being ruined if a shock 1042 leaks because silicon will not soak into the hard drive 904 surface as would a conventionally used shock oil. Each of the six shocks 1042 is preferably in a neutral position when the internal housing 614 is centered inside the internal box 212. Due to the relative positions of the shock assemblies 616, opposing collinear shocks 1042 balance one another to avoid potentially damaging nonuniform forces on the internal housing 614.

Figure 14:
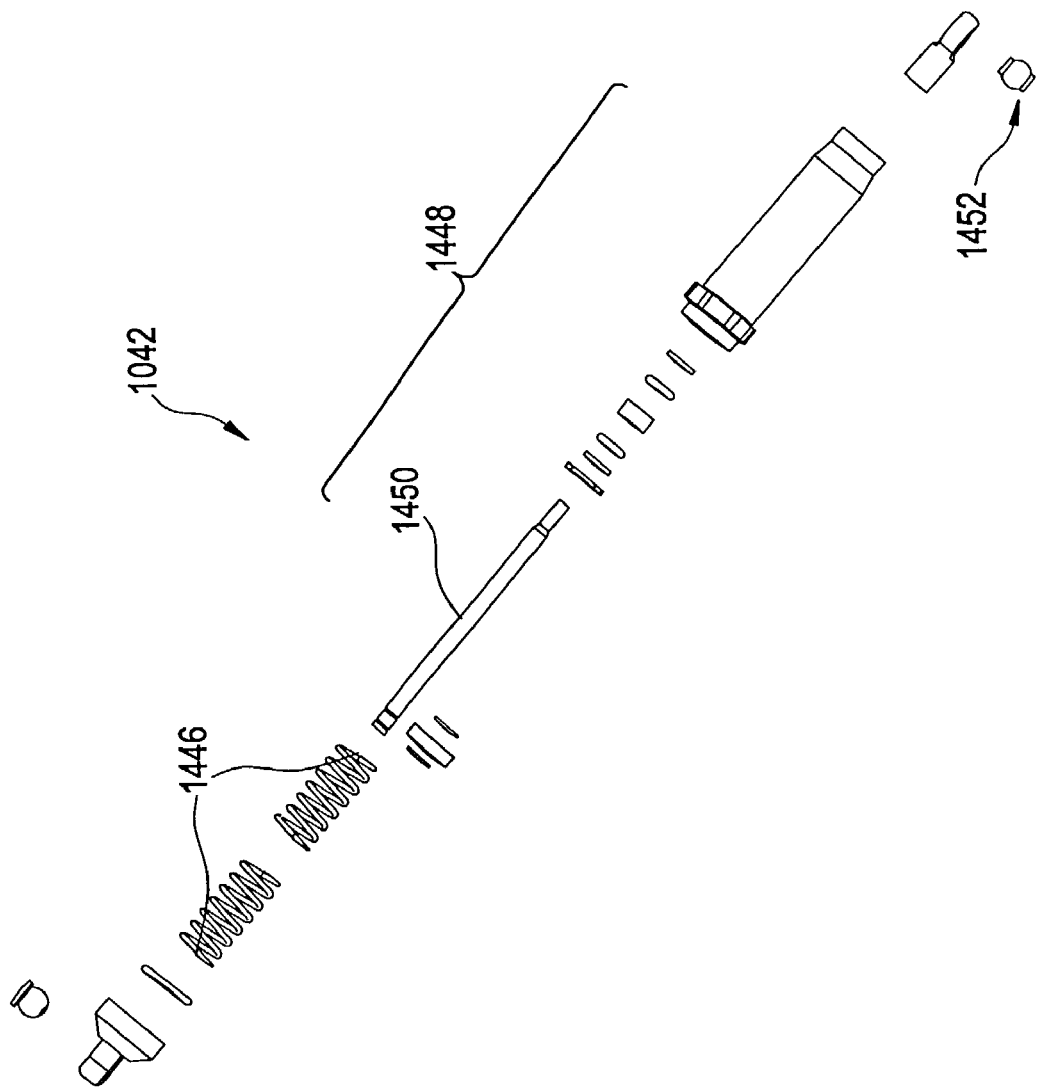
FIG. 14 illustrates an exploded view of a shock.

In a preferred embodiment, each of six shocks 1042 is comprised of one or more stainless steel springs 1446, a piston 1448, an aluminum shaft 1450, and a ball joint 1452 on each end of the shock 1042. See FIG. 14. Because each shock 1042 has ball joints 1452 at both ends, gyroscopic rotation can occur. Ball joints 1452 on one end of each of the shocks 1042 connect to one of two base housings 1044 attached to the internal housing 614. See FIG. 10. There are also provided internal box base housings 1044, either attached to the top and bottom of the internal box 212 or formed as a portion of the internal box 212, and the ball joints 1452 on the other end of each of the shocks 1042 are attached to the internal box base housings 1044 to support and position the internal housing 614 within the internal box 212. The springs 1446 oppose the force of the shock oil to allow a constant and equal load to be applied to both sides of the internal piston 1448, creating a neutral center. Using two shocks 1042 allows a force to be applied and dampened in either of two collinear directions. Because the present invention utilizes multiple, preferably six, bi-directional shocks 1042, a dynamic force originating from any direction around the protective apparatus 100 can be dampened by some combination of shocks 1042 acting along almost an infinite number of axes.

Figure 16:
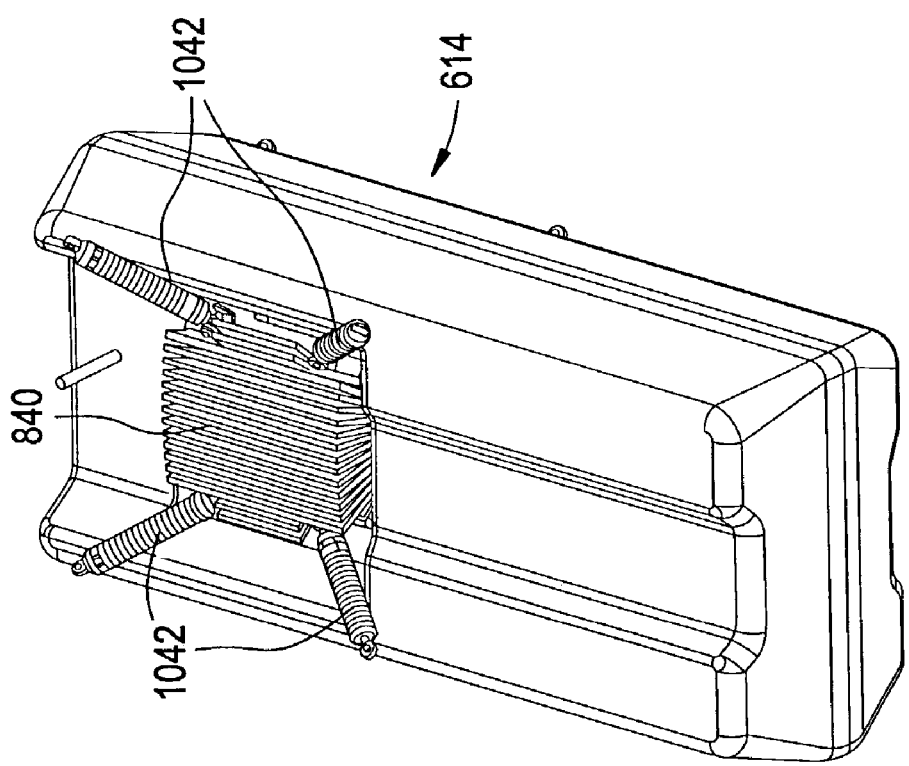
FIG. 16 illustrates yet another preferred embodiment of the present invention.

Although the embodiment described above utilizes two shock assemblies 616, each shock assembly 616 comprising three shocks 1042 and two base housings 1044, the present invention is not limited to this structure. The present invention envisions various shock assembly 616 configurations for protecting the hard drives 904, with examples of suitable configurations depicted in FIGS. 15A, 15B, and 16. Different configurations may be used depending on the configuration of the elements of the protective apparatus 100. Thus, different sized hard drives 904 or other sensitive components, internal housings 614, internal boxes 612, and the like may require different physical configurations for the shock assemblies 616. For instance, such shock assemblies 616 may utilize four shocks 1042, wherein each shock 1042 is disposed at a 45° angle extending from a corner of the internal box 212 toward the internal housing 614 substantially centered within the internal box 212. Other configurations may also be utilized, depending on the particular structure and physical demands that would be required of the protective apparatus 100, e.g., types and amount of forces. The present invention is designed to utilize any number or configuration of shocks 1042 that would provide the optimum shock absorption in combination with a particular housing size and shape.

For example, FIGS. 15A and 15B depict a suspension design which includes eight shocks 1042 (some not visible in the orientation of this figure), each in a 45 and 45 degree configuration extending from a corner of the internal housing 614. The result is equal dampening of force in any direction proportionate to the symmetry of suspended mass. In other words, if the suspended internal housing 614 is continuous in density and truly symmetrical one can apply force in any direction and expect the same force dampening result. Although the configuration of FIGS. 15A and 15B may be best from the standpoint of absorbing impacts in a certain application, much more space is required for the shocks 1042 than in other possible configurations and this sample configuration may be impractical for certain applications.

In the compression molding technique of the present invention, the outer casing 106 can be molded more efficiently than in conventional devices. In particular, a thermoset/thermoplastic hybrid composite with a binding component such as, but not limited to, Nylon 6 is used. Other binding components may include PVC, polypropylene, and the like. Other composites, such as Kevlar™ or fiberglass, may be utilized for the outer casing 106 or internal box 212, either alone or in combination with the thermoset/thermoplastic hybrid. The composite provides strength and shielding to the device. A preferred composite is thermally conductive, impact-resistant, strong, and easy to mold.

A method for assembling the protective apparatus 100 of the present invention will now be described. A preferred method for assembling the protective apparatus 100, described below, includes assembling the internal housing 614, assembling the internal box 212, assembling the shocks 1042 to the internal box 212, mounting the internal housing 614 to the internal box 212 and shocks 1042, and mounting the internal box 212 to the outer casing 106.

The internal box 212 is attached to the top shell 118, so as to suspend the internal box 212 from the top shell 118. A CPU assembly 602, possibly embodied as a carrier board 602 as shown in FIG. 6, may be attached to the internal box 212. The CPU assembly 602 may be operative to control the digital patroller device as a whole, the hard drives 904, the thermostat for the fans 324, or any other desired function. The CPU assembly 602, when provided, would then be wired to the connector panel 410 and any other inputs/outputs needed to effectuate the desired control scheme. The fan and connector panels 108,410 are attached to the internal box 212, possibly via the flanges 654. The top and bottom shells 118,120 may be attached to the internal box 212 and fan and connector panels 118,120 to complete the protective apparatus 100 at a later time, so that the system can be tested before being finally assembled.

With respect to the assembly of the internal housing 614, first the main body 836 is provided without any hard drives 904 therein. Next, heat sinks 840 and hard drives 904 are attached to the main body 836. Finally, the front and back covers 838 are fastened to the front and back openings of the main body 836 to complete the internal housing 614.

With the present invention, a hard drive 904 can be protected from impacts, vibrations, temperature extremes, and various other acts which might harm or erase the data in the hard drive 904. This protection is primarily accomplished by the absorption of physical impacts and vibrations via the shock assembly 616 and the protective material of the outer casing 106. Moreover, due to the presence of multiple hard drives 904 in the preferred embodiment, each hard drive 904 serves as a back-up device for one or more other hard drives 904, thus securing the data saved even if one or more of the hard drives 904 should become disabled.

This device is particularly useful in law enforcement applications but may be utilized in other, possibly heavy-duty, applications wherein the storage of data for later retrieval is important. Data that could be stored on a hard drive 904 housed in the protective apparatus of the present invention includes: video, audio, GPS, weather, vehicle speed, and other data that might be helpful to law enforcement personnel. However, the present invention could also or instead be used in other applications unrelated to law enforcement but wherein data must be securely stored in a hostile or heavy-duty environment.

It will be apparent to those skilled in the art that various modifications and variations can be made to the present invention without departing from the spirit or scope of the invention. The configuration of the shocks 1042, shock assembly 616, and various housings, as well as the materials of the housings, of the invention could be altered to suit a particular application. Thus, it is intended that the claims cover any and all modifications and variations of the present invention.

What is claimed is:

1. A protective apparatus for sensitive components, comprising:
   an outer casing;
   an internal box located within and mounted to the outer casing;
   an internal housing contained within the internal box, wherein at least one sensitive component is contained within the internal housing; and
   at least one shock assembly suspending the internal housing within the internal box, wherein said at least one shock assembly comprises:
  at least one shock comprising two linearly separated ends and a ball joint on each end, wherein the ball joint of each end is mounted to said internal housing and said internal box, respectively.

2. The protective apparatus of claim 1, wherein each shock assembly further comprises at least two base housings, wherein said at least one shock connects said at least two base housings so that each ball joint is mounted to said internal housing and said internal box via said at least two base housings, respectively, and wherein at least one base housing is mounted on or formed integrally with the internal housing and at least one other base housing is mounted on or formed integrally with the internal box.

3. The protective apparatus of claim 1, wherein at least a portion of the outer casing is formed of a compression molded thermostat/thermoplastic hybrid composite material.

4. The protective apparatus of claim 1, including a fan panel having at least one fan and at least one filter, wherein the fan panel forms a portion of the outer casing and is operative to provide airflow to the outer casing.

5. The protective apparatus of claim 1, including a connector panel, wherein the connector panel forms a portion of the outer casing and is operative to provide a control interface for the sensitive components.

6. The protective apparatus of claim 1, wherein in at least one sensitive component is a hard drive.

7. The protective apparatus of claim 6, wherein two or more hard drives are contained within the internal housing and the same data is stored on multiple hard drives to provide a redundant system.

8. The protective apparatus of claim 1, wherein a central processing unit (CPU) is mounted on the internal box.

9. The protective apparatus of claim 1, wherein the internal housing includes at least one heat sink.

10. A protective apparatus for sensitive components, comprising:
  an outer casing;
  an internal box located within and mounted to the outer casing;
  an internal housing contained within the internal box, wherein at least one sensitive component is contained within the internal housing; and
  at least one shock assembly suspending the internal housing within the internal box,
  wherein said at least one shock assembly includes at least one shock connecting at least two base housings, and at least one base housing is mounted on or formed integrally with the internal housing and at least one other base housing is mounted on or formed integrally with the internal box, and
  wherein each shock has two linearly separated ends with a ball joint on each end and the ball joint of each end is mounted to a base housing.

11. A method for producing a protective apparatus for sensitive components, including the steps of:
  assembling an internal housing;
  assembling an internal box;
  attaching one end of at least one shock to the internal box, wherein said at least one shock comprises two linearly separated ends and a ball joint on each of said ends;
  attaching an other of said two ends of the shock to the internal housing to suspend the internal housing within the internal box;
  providing an outer casing; and
  mounting the internal box within the outer casing.

12. The method of claim 11, wherein the step of providing an outer casing includes:
  producing the outer casing by at least partially practicing a compression molding technique on a thermoset/thermoplastic hybrid composite material.

13. The method of claim 11, wherein the step of providing an outer casing includes:
  providing a top shell and a bottom shell;
  providing a fan panel;
  providing a connector panel; and
  attaching the top and bottom shells, the fan panel, and the connector panel together to form the outer casing.

14. The method of claim 11, wherein the step of assembling an internal housing includes:
  providing at least one sensitive component;
  providing a main body;
  mounting the sensitive component within the main body;
  providing at least one heat sink; and
  attaching the heat sink to the main body to form the internal housing.

15. A digital patroller device operative to store at least one of audio and video data, the digital patroller device comprising:
  at least one data source;
  at least one hard drive;
  a protective apparatus adapted to protect the hard drive, the protective apparatus including:
    an outer casing;
    an internal box located within and mounted to the outer casing;
    an internal housing contained within the internal box, wherein at least one sensitive component is contained within the internal housing; and
    at least one shock assembly suspending the internal housing within the internal box; and
  at least one input/output connector operative to provide communication between the data source and the protective apparatus,
  wherein said at least one shock assembly comprises:
    at least one shock comprising two linearly separated ends and a ball joint on each end, wherein the ball joint of each end is mounted to said internal housing and said internal box, respectively.

16. A protective apparatus for sensitive components, comprising:
  an outer casing;
  an internal box located within and mounted to the outer casing, wherein at least one sensitive component is contained within the internal box;
  an internal housing contained within the internal box; and
  two shock assemblies suspending the internal housing within the internal box, each shock assembly including two base housings and at least three shocks, wherein one of the base housings is mounted to or formed integrally with each of the internal box and the internal housing, each shock has two ends spaced apart along a shock axis with a ball joint on each end connected to one or the other of the base housings, and each shock of one shock assembly has the shock axis parallel to one shock of the other shock assembly.

17. The protective apparatus of claim 16, wherein the internal housing has at least eight corners, each shock assembly has at least four shocks, and an end of a shock is attached to the internal housing near each corner of the internal housing.

* * * * *